United States Patent
Minoura et al.

(10) Patent No.: US 9,425,268 B2
(45) Date of Patent: Aug. 23, 2016

(54) COMPOUND SEMICONDUCTOR DEVICE AND METHOD OF MANUFACTURING THE SAME

(71) Applicant: Transphorm Japan, Inc., Yokohama, Kanagawa (JP)

(72) Inventors: Yuichi Minoura, Zama (JP); Yoshitaka Watanabe, Aidumisato (JP)

(73) Assignee: Transphorm Japan, Inc., Yokohama (JP)

( * ) Notice: Subject to any disclaimer, the term of this patent is extended or adjusted under 35 U.S.C. 154(b) by 9 days.

(21) Appl. No.: 14/010,824

(22) Filed: Aug. 27, 2013

(65) Prior Publication Data

US 2014/0092637 A1    Apr. 3, 2014

(30) Foreign Application Priority Data

Sep. 28, 2012 (JP) ................................ 2012-217087

(51) Int. Cl.
*H01L 29/40*    (2006.01)
*H02M 3/28*    (2006.01)
(Continued)

(52) U.S. Cl.
CPC ........ *H01L 29/408* (2013.01); *H01L 21/28264* (2013.01); *H01L 23/3171* (2013.01); *H01L 29/401* (2013.01); *H01L 29/66462* (2013.01); *H01L 29/66522* (2013.01); *H01L 29/7787* (2013.01); *H01L 29/78* (2013.01); *H02M 3/28* (2013.01); *H01L 23/291* (2013.01);
(Continued)

(58) Field of Classification Search
CPC ................ H01L 29/408; H01L 29/401; H01L 29/66462

USPC .............................. 363/17; 257/192; 438/572
See application file for complete search history.

(56) References Cited

U.S. PATENT DOCUMENTS 7,071,498 B2 * 7/2006 Johnson et al. ............... 257/192
7,961,482 B2 * 6/2011 Ribarich .................... 363/21.03
(Continued)

FOREIGN PATENT DOCUMENTS

CN    102237405    11/2011
CN    102651385 A  *  8/2012 .............. H01L 29/36
(Continued)

OTHER PUBLICATIONS

Saito, et al., "Design and Demonstration of High Breakdown Voltage GaN High Electron Mobility Transistor (HEMT) Using Field Plate Structure for Power Electronics Applications", 2004, Japanese Journal of Applied Physics, vol. 43, No. 4B, p. 2239-2242.*

(Continued)

*Primary Examiner* — Tom Thomas
*Assistant Examiner* — Vincent Wall
(74) *Attorney, Agent, or Firm* — Fish & Richardson P.C.

(57) ABSTRACT

A compound semiconductor device includes: a compound semiconductor layered structure; a gate electrode formed above the compound semiconductor layered structure; a first protective insulating film that covers a surface of the compound semiconductor layered structure and is made of silicon nitride as a material; a second protective insulating film that covers the gate electrode on the first protective insulating film and is made of silicon oxide as a material; and a third protective insulating film that contains silicon oxynitride and is formed between the first protective insulating film and the second protective insulating film.

10 Claims, 13 Drawing Sheets

(51) Int. Cl.
*H01L 21/28* (2006.01)
*H01L 29/66* (2006.01)
*H01L 29/78* (2006.01)
*H01L 29/778* (2006.01)
*H01L 23/31* (2006.01)
*H02M 3/335* (2006.01)
*H02M 7/04* (2006.01)
*H02M 1/00* (2006.01)
*H01L 29/423* (2006.01)
*H01L 23/29* (2006.01)
*H01L 29/51* (2006.01)
*H01L 29/20* (2006.01)

(52) U.S. Cl.
CPC ........... *H01L29/2003* (2013.01); *H01L 29/402* (2013.01); *H01L 29/42376* (2013.01); *H01L 29/517* (2013.01); *H01L 2924/0002* (2013.01); *H02M 3/33576* (2013.01); *H02M 7/04* (2013.01); *H02M 2001/007* (2013.01)

(56) References Cited

U.S. PATENT DOCUMENTS

| | | | | |
|---|---|---|---|---|
| 7,985,986 | B2* | 7/2011 | Heikman et al. | 257/194 |
| 8,120,064 | B2* | 2/2012 | Parikh | H01L 29/402 257/192 |
| 8,237,198 | B2* | 8/2012 | Wu et al. | 257/194 |
| 2006/0124962 | A1* | 6/2006 | Ueda | H01L 21/28581 257/192 |
| 2007/0018210 | A1* | 1/2007 | Sheppard | 257/289 |
| 2007/0158683 | A1* | 7/2007 | Sheppard et al. | 257/183 |
| 2010/0044752 | A1* | 2/2010 | Marui | 257/192 |
| 2011/0042719 | A1* | 2/2011 | Sazawa | H01L 29/66462 257/190 |
| 2012/0217543 | A1* | 8/2012 | Minoura | H01L 21/2654 257/190 |
| 2014/0091424 | A1* | 4/2014 | Makiyama | H01L 29/66431 257/472 |
| 2014/0092636 | A1* | 4/2014 | Kanamura | H01L 29/4966 363/17 |
| 2015/0021671 | A1* | 1/2015 | Nagahisa | H01L 21/0217 257/288 |

FOREIGN PATENT DOCUMENTS

| | | | | |
|---|---|---|---|---|
| JP | 2012178467 | A * | 9/2012 | H01L 21/338 |
| TW | 201236082 | | 9/2012 | |

OTHER PUBLICATIONS

Office Action in TW Application No. 102130787, mailed Apr. 21, 2015, 7 pages.

* cited by examiner

COMPOUND SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2012-217087, filed on Sep. 28, 2012, the entire contents of which are incorporated herein by reference.

FIELD

The embodiments discussed herein are directed to a compound semiconductor device and a method of manufacturing the same.

BACKGROUND

A nitride semiconductor including characteristics such as high saturation electron speed and wide band gap can be utilized in a semiconductor device having a high withstand voltage and high output power. For example, the band gap of GaN as the nitride semiconductor is 3.4 eV, which is larger than the band gap of Si (1.1 eV) and the band gap of GaAs (1.4 eV), and thus GaN has high breakdown electric field intensity. Accordingly, GaN is quite promising as a material of a semiconductor device for power supply which obtains high voltage operation and high output power.

As a semiconductor device using the nitride semiconductor, there have been made numerous reports on a field effect transistor, particularly a high electron mobility transistor (HEMT). For example, among GaN-based HEMTs (GaN-HEMTs), AlGaN/GaN.HEMT using GaN as an electron transit layer and AlGaN as an electron supply layer is attracting attention. In the AlGaN/GaN.HEMT, a strain resulted from a lattice constant difference between GaN and AlGaN occurs in AlGaN. Two-dimensional electron gas (2DEG) of high concentration is obtained from piezoelectric polarization and spontaneous polarization of AlGaN caused by the strain. Accordingly, the AlGaN/GaN.HEMT is expected as a high efficiency switch element and a high-withstand-voltage electric power device for electric vehicle, or the like.

Patent Document 1: Japanese Laid-open Patent Publication No. 2012-178467

In the GaN-HEMTs, a current collapse phenomenon that electrons are trapped in an element to interfere with the flow of 2DEG and decrease output current is seen as a problem. The current collapse is regarded as occurring due to various causes, and the current collapse is considered to possibly occur due to an insulating film such as a protective film or the like covering the gate electrode. However, any technique useful for suppressing occurrence of the current collapse has not been developed at present for the protective film covering the gate electrode.

SUMMARY

An aspect of a compound semiconductor device includes: a compound semiconductor layered structure; an electrode formed above the compound semiconductor layered structure; a first protective insulating film that covers a surface of the compound semiconductor layered structure and is made of silicon nitride as a material; a second protective insulating film that covers the electrode on the first protective insulating film and is made of silicon oxide as a material; and a third protective insulating film that contains silicon oxynitride and is formed between the first protective insulating film and the second protective insulating film.

An aspect of a method of manufacturing a compound semiconductor device, includes: forming a compound semiconductor layered structure; forming an electrode above the compound semiconductor layered structure; forming a first protective insulating film that covers a surface of the compound semiconductor layered structure and is made of silicon nitride as a material; forming a second protective insulating film that covers the electrode on the first protective insulating film and is made of silicon oxide as a material; and forming a third protective insulating film that contains silicon oxynitride, between the first protective insulating film and the second protective insulating film.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Embodiment

In this embodiment, an AlGaN/GaN HEMT of a nitride semiconductor is disclosed as a compound semiconductor device.

FIG. 1A to FIG. 1C to FIG. 3A and FIG. 3B are schematic cross-sectional views illustrating a method of manufacturing the AlGaN/GaN HEMT according to a first embodiment in order of processes.

Figure 1A:
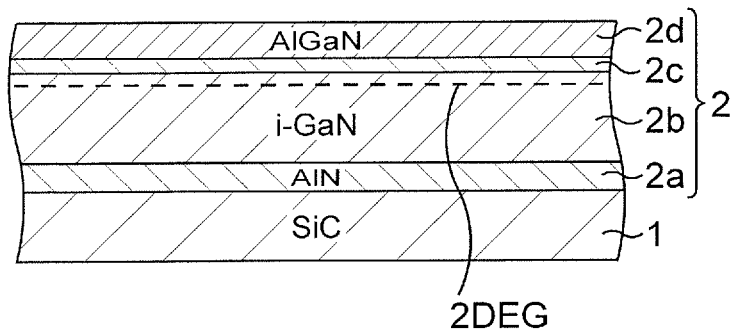
FIG. 1A to FIG. 1C are schematic cross-sectional views illustrating a method of manufacturing an AlGaN/GaN HEMT according to a first embodiment in order of processes.

First, as illustrated in FIG. 1A, a compound semiconductor layered structure 2 is formed on, for example, a semi-insulating SiC substrate 1 being a growth substrate. As the growth substrate, a Si substrate, a sapphire substrate, a GaAs substrate, a GaN substrate or the like may be used instead of the SiC substrate. The conductivity of the substrate may be either semi-insulating or conductive.

The compound semiconductor layered structure 2 includes a buffer layer 2a, an electron transit layer 2b, an intermediate layer 2c, and an electron supply layer 2d.

In the compound semiconductor layered structure 2, two-dimensional electron gas (2DEG) is generated in the vicinity of an interface, of the electron transit layer 2b, with the electron supply layer 2d (to be exact, the intermediate layer 2c). The 2DEG is generated based on a lattice constant difference between the compound semiconductor (here, GaN) of the electron transit layer 2b and the compound semiconductor (here, AlGaN) of the electron supply layer 2d.

More specifically, on the SiC substrate 1, the following compound semiconductors are grown by, for example, an MOVPE (Metal Organic Vapor Phase Epitaxy) method. An MBE (Molecular Beam Epitaxy) method or the like may be used instead of the MOVPE method.

On the SiC substrate 1, AlN is grown to a thickness of about 50 nm, i(intentionally undoped)-GaN is grown to a thickness of about 1 μm, i-AlGaN is grown to a thickness of about 5 nm, and n-AlGaN is grown to a thickness of about 30 nm in order. Thus, the buffer layer 2a, the electron transit layer 2b, the intermediate layer 2c, and the electron supply layer 2d are formed. As the buffer layer 2a, AlGaN may be used instead of AlN or GaN may be grown at a low temperature. On the electron supply layer 2d, n-GaN is grown to form a thin cap layer in some cases.

As a growth condition of AlN, mixed gas of trimethylaluminum (TMA) gas and ammonia ($NH_3$) gas is used as a source gas. As a growth condition of GaN, mixed gas of trimethylgallium (TMG) gas and $NH_3$ gas is used as a source gas. As a growth condition of AlGaN, mixed gas of TMA gas, TMG gas, and $NH_3$ gas is used as a source gas. According to the compound semiconductor layers to be grown, whether or not to supply the trimethylaluminum gas being an Al source and the trimethylgallium gas being a Ga source and flow rates thereof are appropriately set. The flow rate of the ammonia gas being a common source is set to about 100 ccm to about 10 LM. Further, growth pressure is set to about 50 Torr to about 300 Torr, and growth temperature is set to about 1000° C. to about 1200° C.

In order to grow AlGaN as an n-type, that is, to grow n-AlGaN of the electron supply layer 2d, for example, $SiH_4$ gas containing Si as n-type impurity is added to the source gas at a predetermined flow rate, thereby doping AlGaN with Si. A doping concentration of Si is set to about $1\times10^{18}/cm^3$ to about $1\times10^{20}/cm^3$, for example, set to about $5\times10^{18}/cm^3$.

Subsequently, not-illustrated element isolation structures are formed.

More specifically, argon (Ar), for instance, is injected to the element isolation structures in the compound semiconductor layered structure 2. Thus, the element isolation structures are formed in the compound semiconductor layered structure 2 and in a surface layer portion of the SiC substrate 1. The element isolation structures demarcate an active region on the compound semiconductor layered structure 2.

Incidentally, the element isolation may be performed using, instead of the above injection method, for example, an STI (Shallow Trench Isolation) method or the like. In this event, for example, chlorine-based etching gas is used for dry etching of the compound semiconductor layered structure 2.

Figure 1B:
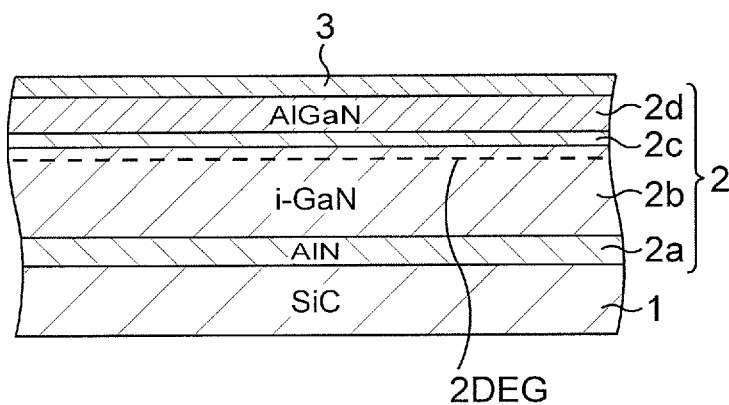

Subsequently, as illustrated in FIG. 1B, a first protective insulating film 3 is formed.

More specifically, silicon nitride (SiN) is deposited on the compound semiconductor layered structure 2 to a thickness of, for example, about 30 nm to about 500 nm, for example, about 100 nm by a plasma CVD method, a sputtering method or the like. Thus, the first protective insulating film 3 is formed.

SiN can reduce current collapse by using a passivation film covering the compound semiconductor layered structure 2.

Subsequently, as illustrated in FIG. 10, an electrode recess 3a is formed in the first protective insulating film 3.

More specifically, a resist is applied on the surface of the first protective insulating film 3. The resist is processed by lithography to form an opening in the resist which exposes the surface of the first protective insulating film 3 corresponding to a formation planned region for the gate electrode (electrode formation planned region). Thus, a resist mask having the opening is formed.

Using this resist mask, the electrode formation planned region of the first protective insulating film 3 is dry etched and removed until the surface of the electron supply layer 2d is exposed. Thus, the electrode recess 3a which exposes the electrode formation planned region on the surface of the electron supply layer 2d is formed in the first protective insulating film 3. For the dry etching, for example, fluorine-based etching gas is used. The dry etching is required to cause etching damage to the electron supply layer 2d as little as possible, and the dry etching using the fluorine-based gas causes little etching damage to the electron supply layer 2d.

The electrode recess may be formed by wet etching using a fluorine-based solution instead of the dry etching.

Thereafter, the resist mask is removed by ashing using oxygen plasma or wetting using a chemical solution.

Figure 2A:
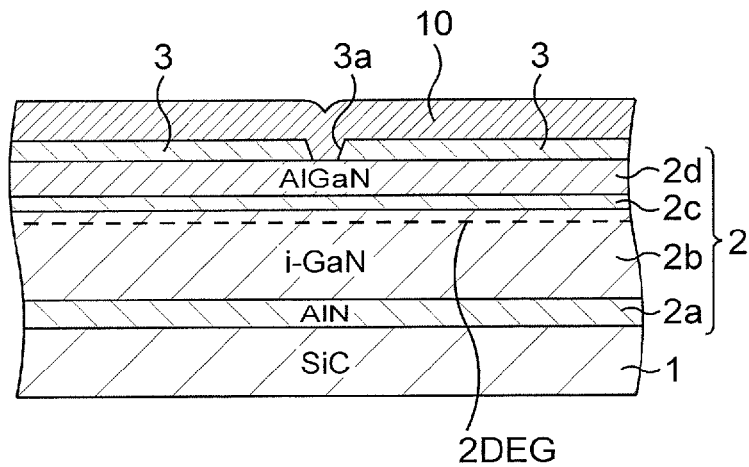
FIG. 2A to FIG. 2C are schematic cross-sectional views, subsequent to FIG. 1A to FIG. 1C, illustrating the method of manufacturing the AlGaN/GaN HEMT according to the first embodiment in order of processes.

Subsequently, as illustrated in FIG. 2A, an electrode material 10 for the gate electrode and the field plate electrode is deposited.

More specifically, the electrode material 10 is deposited on the first protective insulating film 3 to fill the inside of the electrode recess 3a. Ni/Au (a lower layer is Ni and an upper layer is Au) for example is deposited as the electrode material 10 by the vapor deposition method for example. The thickness of Ni is about 30 nm, and the thickness of Au is about 400 nm.

Subsequently, as illustrated in FIG. 23, a gate electrode 4 and a field plate electrode 5 are formed.

More specifically, a resist is applied on the surface of the electrode material 10. The resist is processed by lithography to remain only in electrode formation planned regions for the gate electrode and the field plate electrode (electrode formation planned regions) of the electrode material 10. Thus, the resist mask covering the electrode formation planned regions is formed.

Using this resist mask, the electrode material 10 is dry etched until the surface of the first protective insulating film 3 is exposed. For the dry etching, for example, chlorine-based etching gas can be used. Even when the electrode material 10 is dry etched using the chlorine-based gas, the electron supply layer 2d is never exposed to the dry etching and has no etching damage because the top of the electron supply layer 2d is covered with the first protective insulating film 3.

Thus, the gate electrode 4 in a shape that fills the electrode recess 3a and rides on the first protective insulating film 3 (having a cross section along the gate length direction in a so-called overhanging shape) is formed in the formation planned region for the gate electrode. At the same time, the field plate electrode 5 is formed on the first protective insulating film 3 in the formation planned region for the field plate electrode. The gate electrode 4 is in Schottky contact with the compound semiconductor layered structure 2 the electron supply layer 2d) in the electrode recess 3a.

Thereafter, the resist mask is removed by asking using oxygen plasma or wetting using a chemical solution.

In the AlGaN/GaN HEMT, a large voltage is sometimes applied to the drain electrode as compared to those to a source electrode and the gate electrode. In this embodiment, by providing the field plate electrode 5, the electric field generated due to the application of the large voltage can be relaxed by the field plate electrode 5. The field plate electrode 5 is electrically connected to the gate electrode 4 or the later-described source electrode as necessary.

Figure 2B:
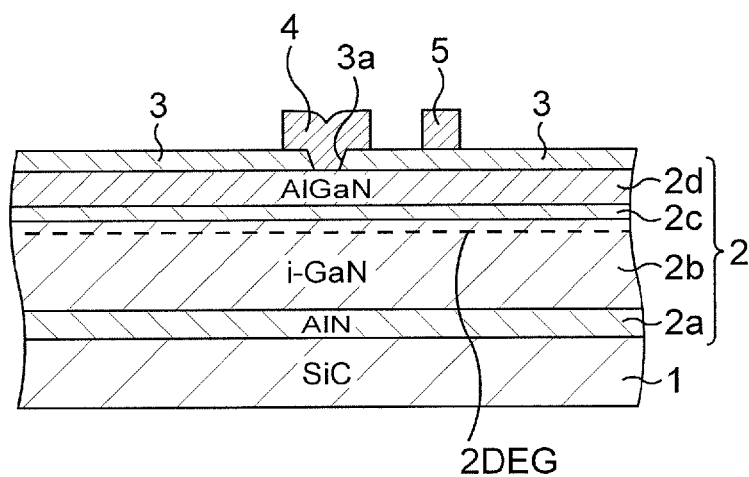
Figure 2C:
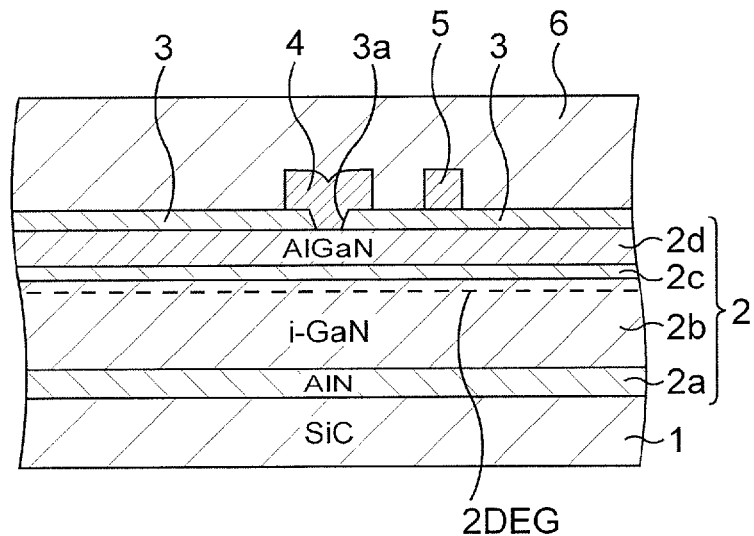

Subsequently, as illustrated in FIG. 2C, a second protective insulating film 6 is formed.

More specifically, silicon oxide ($SiO_2$) is deposited to a thickness of, for example, about 500 nm on the first protective insulating film 3 in a manner to cover the gate electrode 4 and the field plate electrode 5. Thus, the second protective insulating film 6 is formed. $SiO_2$ is deposited by the CVD method using, for example, tetraethoxysilane (TEOS) as a material. $SiO_2$ may be deposited by SOG (Spin On Glass) using TEOS instead of the CVD method. Further, it is also preferable to deposit $SiO_2$ by the CVD method using silane or triethoxysilane as a material instead of using TEOS.

$SiO_2$ is excellent because it is low in dielectric constant and relatively high in dielectric breakdown withstand voltage in terms of material characteristics. $SiO_2$ formed using TEOS is excellent in step coverage and thus has high filling and planarization effect. Therefore, $SiO_2$ is widely used in the process of the Si devices and also easy of mass production.

Figure 3A:
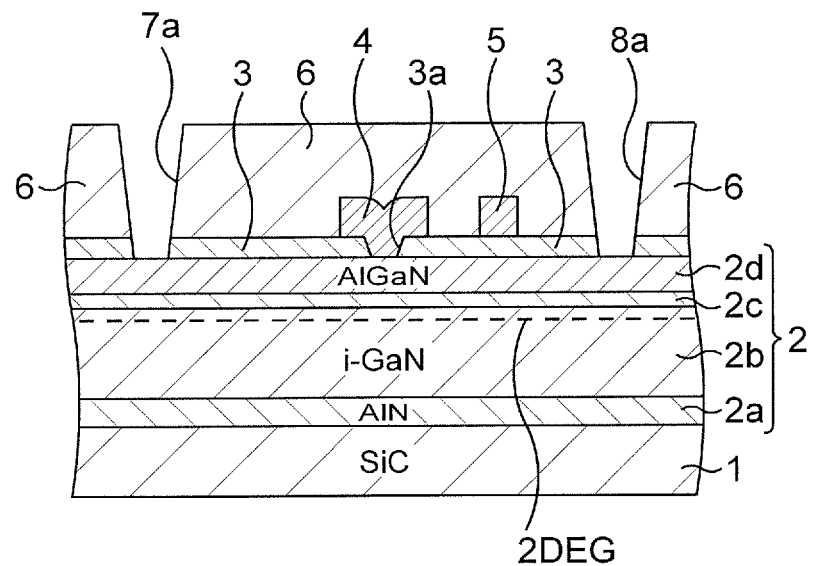
FIG. 3A and FIG. 3B are schematic cross-sectional views, subsequent to FIG. 2A to FIG. 2C, illustrating the method of manufacturing the AlGaN/GaN HEMT according to the first embodiment in order of processes.

Subsequently, as illustrated in FIG. 3A, contact holes 7a, 8a are formed in the first protective insulating film 3 and the second protective insulating film 6.

More specifically, a resist is applied on the surface of the second protective insulating film 6. The resist is processed by lithography to form openings in the resist which expose the surface of the second protective insulating film 6 corresponding to formation planned regions for the source electrode and the drain electrode (electrode formation planned regions). Thus, a resist mask having the openings is formed.

The electrode formation planned regions of the second protective insulating film 6 and the first protective insulating film 3 are dry etched and removed until the surface of the electron supply layer 2d is exposed. As an etching gas, for example, fluorine-based gas is used. By performing the dry etching using the fluorine-based gas on the second protective insulating film 6 and the first protective insulating film 3 on the electron supply layer 2d, the etching damage to the exposed electron supply layer 2d can be suppressed. Thus, the contact holes 7a, 8a are formed in the first protective insulating film 3 and the second protective insulating film 6.

Thereafter, the resist mask is removed by ashing using oxygen plasma or wetting using a chemical solution.

Figure 3B:
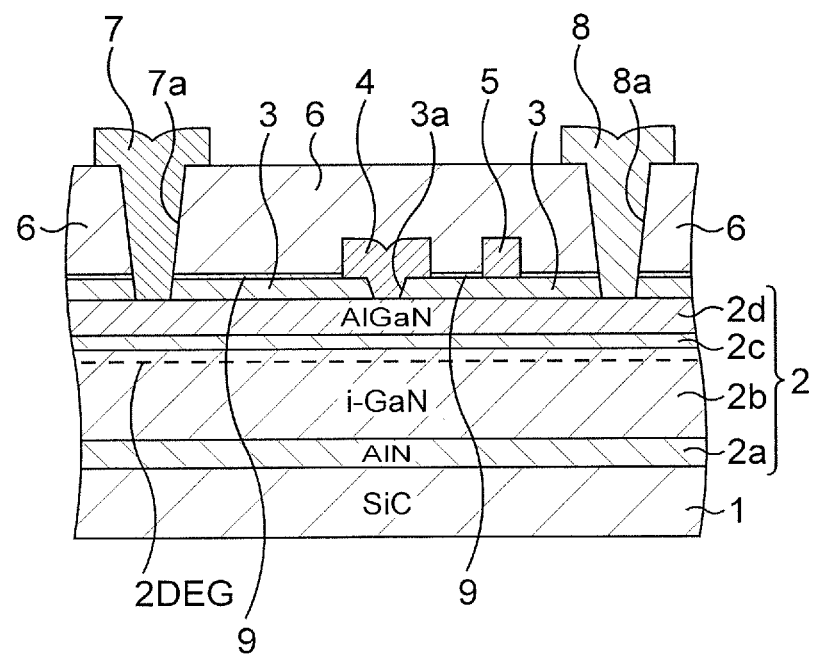

Subsequently, as illustrated in FIG. 3B, a source electrode 7 and a drain electrode 8 are formed.

More specifically, a resist is applied on the second protective insulating film 6, and openings which expose the inside of the contact holes 7a, 8a are formed. Thus, a resist mask having the openings is formed.

Using this resist mask, Ta/Al for example is deposited as an electrode material by the vapor deposition method, for example, on the resist mask including the inside of the openings for exposing the inside of the contact holes 7a, 8a. The thickness of Ta is about 20 nm, and the thickness of Al is about 300 nm. By the lift-off method, the resist mask and Ta/Al deposited thereon are removed.

Thereafter, the SiC substrate 1 is heat treated at a temperature of about 500° C. to about 1000° C., for example, about 550° C., in a nitrogen atmosphere, for example, thereby bringing the remaining Ta/Al into ohmic contact with the electron supply layer 2d. If the temperature of the heat treatment is lower than 500° C., sufficient ohmic contact cannot be obtained. If the temperature of the heat treatment is higher than 1000° C., Al of the electrode material melts and a desired electrode cannot be obtained. By the heat treatment at a temperature of about 500° C. to about 1000° C., a desired electrode with sufficient ohmic contact can be obtained. Thus, the source electrode 7 and the drain electrode 8 are formed such that the inside of the contact holes 7a, 8a are filled with part of the electrode material.

Thereafter, through processes such as forming wirings connected to the gate electrode 4, the source electrode 7, and the drain electrode 8, electrical connection of the field plate electrode 5 with the gate electrode 4 or the source electrode 7 and so on, the Schottky-type AlGaN/GaN.HEMT according to this embodiment is formed.

In this embodiment, at the time of FIG. 3B, a third protective insulating film 9 containing silicon oxynitride (SiON) is formed (at the interface) between the first protective insulating film 3 and the second protective insulating film 6. The third protective insulating film 9 is formed to a thickness within a range of about 1 nm to about 10 nm, for example, about 5 nm.

The third protective insulating film 9 is considered to be formed because of the following reason (1) or reason (2), or both of the reasons (1) and (2). In the illustrated example, on the assumption of the reason (1), the third protective insulating film is not illustrated at the stage of FIG. 2C but is illustrated at the stage of FIG. 3B.

Reason (1)

As illustrated in FIG. 2B, due to the etching when forming the gate electrode 4 and the field plate electrode 5, the surface of the first protective insulating film 3 is damaged and Si dangling bonds are generated on the surface.

When the source electrode 7 and the drain electrode 8 are formed as illustrated in FIG. 3B, the high-heat treatment is performed at a temperature of about 500° C. to about 1000° C. (about 550° C. in this embodiment) in order to obtain the ohmic contact with respect to the electron supply layer 2d. Due to this high-heat treatment, the first protective insulating film 3 is considered to react with the second protective insulating film 6 to generate SiON where Si—O—Si bonding and Si—N—Si bonding present in a mixed manner to form the third protective insulating film 9.

Reason (2)

When the second protective insulating film 6 is formed on the first protective insulating film 3 as illustrated in FIG. 2C, $SiO_2$ of the first protective insulating film 3 is bonded with Si dangling bonds present on the surface of the first protective insulating film 3 at the interface between the first protective insulating film 3 and the second protective insulating film 6. Due to the bonding, SiON where Si—O—Si bonding and Si—N—Si bonding present in a mixed manner is considered to be generated to form the third protective insulating film 9.

A state where the third protective insulating film 9 is not formed but the second protective insulating film 6 is formed on the first protective insulating film 3 in a manner to be in contact with the first protective insulating film 3 is discussed. In this case, the Si dangling bonds generated due to the difference in bonding length between Si—O and Si—N resulted from the etching damage of the surface of the first protective insulating film 3 are present at the interface between the first protective insulating film 3 and the second protective insulating film 6. The Si dangling bonds bring about occurrence of current collapse in which electrons are trapped in an element and the flow of 2DEG is inhibited to decrease output current. The occurrence of the current collapse possibly decreases the on-resistance.

In this embodiment, the third protective insulating film 9 containing SiON bonded with Si dangling bonds present on the surface of the first protective insulating film 3 is formed at the interface between the first protective insulating film 3 and the second protective insulating film 6. The third protective insulating film 9 having a structure in an intermediate bonding state between those of the first protective insulating film 3 and the second protective insulating film 6 is formed as a buffer layer at the interface, thereby relaxing the Si dangling bonds to suppress occurrence of the current collapse.

As described above, according to this embodiment, a highly reliable high-withstand-voltage AlGaN/GaN HEMT is realized which suppresses occurrence of the current collapse due to the protective film covering the gate electrode on the compound semiconductor layered structure to improve the device characteristics.

Modification Example

Hereinafter, a modification example of the first embodiment will be described. This example discloses a structure and a method of manufacturing an AlGaN/GaN HEMT as in the first embodiment, but exemplifies a so-called MIS-type AlGaN/GaN HEMT in which a gate electrode is present above a semiconductor via a gate insulating film. Note that the same constituent members and so on as those in the first embodiment will be denoted by the same reference signs, and a detailed description thereof will be omitted.

FIG. 4A and FIG. 4B and FIG. 5A and FIG. 5B are schematic cross-sectional views illustrating main processes in the method of manufacturing the AlGaN/GaN HEMI according to the modification example of the first embodiment.

Figure 1C:
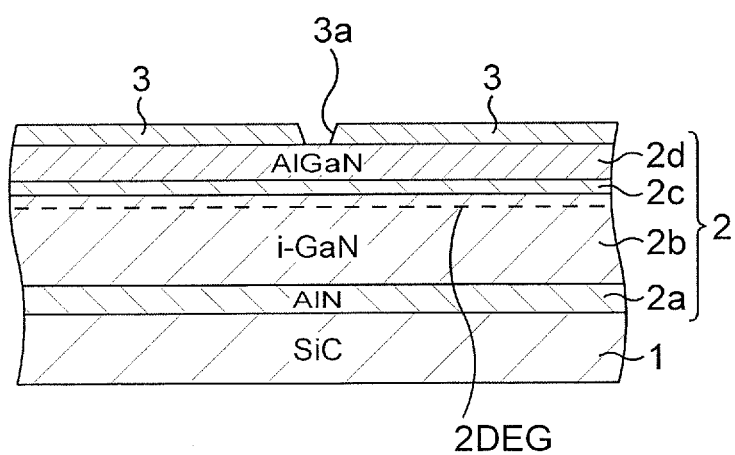

First, the same processes as those in FIG. 1A to FIG. 1C of the first embodiment are performed. In this event, an electrode recess 3a is formed in a first protective insulating film 3 formed on a compound semiconductor layered structure 2.

Figure 4A:
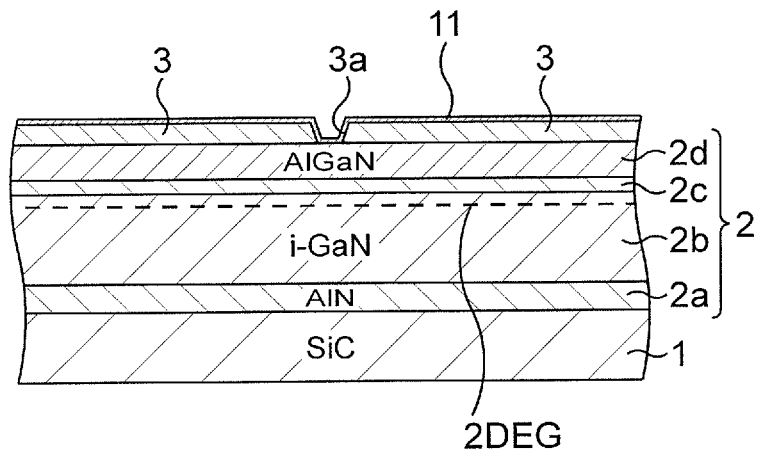
FIG. 4A and FIG. 4B are schematic cross-sectional views illustrating main processes in a method of manufacturing an AlGaN/GaN HEMT according to Modification Example of the first embodiment.

Subsequently, as illustrated in FIG. 4A, a gate insulating film 11 is formed.

In a manner to cover an inner wall surface of the electrode recess 3a, for example, $Al_2O_3$ is deposited as an insulating material on the first protective insulating film 3. $Al_2O_3$ is deposited to a film thickness of about 2 nm to about 200 nm, here, about 50 nm, for example, by an ALD (Atomic Layer Deposition) method. Thus, the gate insulating film 11 is formed.

Incidentally, for the deposition of $Al_2O_3$, a plasma CVD method, a sputtering method, or the like, for instance, may be used instead of the ALD method. Further, instead of depositing $Al_2O_3$, a nitride or an oxynitride of Al may be used. Besides, an oxide, a nitride, an oxynitride of Si, Hf, Zr, Ti, Ta, or W or a multilayer of appropriately selected ones from among these may be deposited to form the gate insulating film.

Figure 4B:
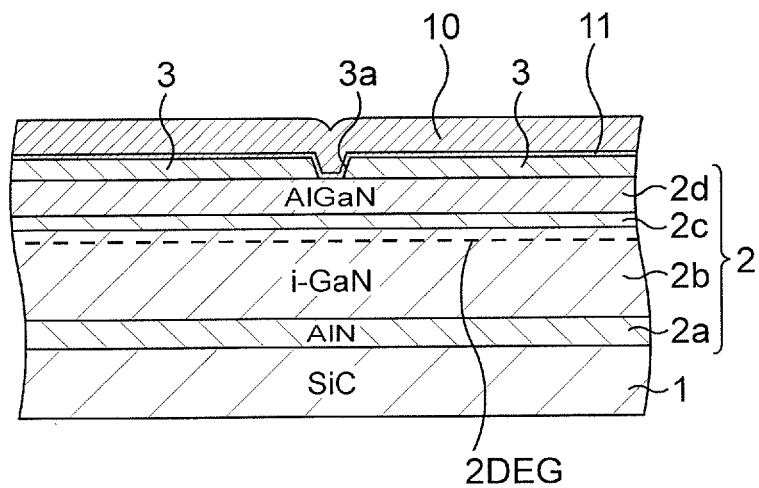

Subsequently, as illustrated in FIG. 4B, an electrode material 10 for a gate electrode and a field plate electrode is deposited.

More specifically, the electrode material 10 for the gate electrode is deposited on the gate insulating film 11 to fill the inside of the electrode recess 3a via the gate insulating film 11. Ni/Au (a lower layer is Ni and an upper layer is Au) for example is deposited as the electrode material 10 by the vapor deposition method for example. The thickness of Ni is about 30 nm, and the thickness of Au is about 400 nm.

Figure 5A:
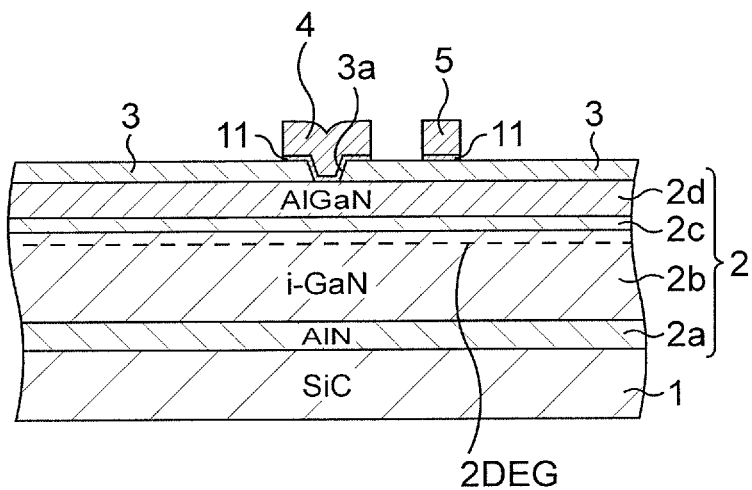
FIG. 5A and FIG. 5B are schematic cross-sectional views, subsequent to FIG. 4A and FIG. 4B, illustrating main processes in the method of manufacturing the AlGaN/GaN HEMT according to Modification Example of the first embodiment.

Subsequently, as illustrated in FIG. 5A, a gate electrode 4 and a field plate electrode 5 are formed.

More specifically, first, a resist is applied on the surface of the electrode material 10. The resist is processed by lithography to remain only in electrode formation planned regions for the gate electrode and the field plate electrode (electrode formation planned regions) in the electrode material 10. Thus, the resist mask covering the electrode formation planned regions is formed.

Using this resist mask, the electrode material 10 and the gate insulating film 11 are dry etched until the surface of the first protective insulating film 3 is exposed. For the dry etching, for example, chlorine-based etching gas can be used. Even when the electrode material 10 and the gate insulating film 11 are dry etched using the chlorine-based gas, the top of the electron supply layer 2d is covered with the first protective insulating film 3, and therefore the electron supply layer 2d is never exposed to the dry etching and has no etching damage.

Thus, the gate electrode 4 in a shape that fills the electrode recess 3a via the gate insulating film 11 and rides on the first protective insulating film 3 (having a cross section along the gate length direction in a so-called overhanging shape) is formed in the formation planned region for the gate electrode. At the same time, the field plate electrode 5 is formed on the first protective insulating film 3 via the gate insulating film 11 in the formation planned region for the field plate electrode.

Thereafter, the resist mask is removed by ashing using oxygen plasma or wetting using a chemical solution.

Figure 5B:
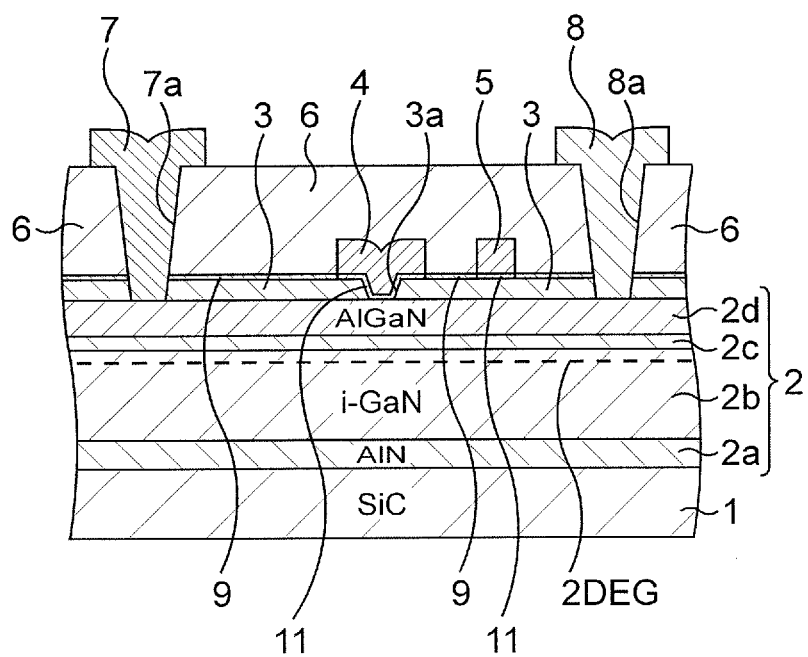

Subsequently, the same processes as those in FIG. 2C to FIG. 3B of the first embodiment are performed. The appearance at this time is illustrated in FIG. 5B.

Thereafter, through processes such as forming wirings connected to the gate electrode 4, the source electrode 7, and the drain electrode 8, electrical connection of the field plate electrode 5 with the gate electrode 4 or the source electrode 7 and so on, the MIS-type AlGaN/GaN.HEMT according to this example is formed.

In this example, a third protective insulating film 9 containing SiON bonded with Si dangling bonds present on the surface of the first protective insulating film 3 is formed at the interface between the first protective insulating film 3 and the second protective insulating film 6 as in the first embodiment. The third protective insulating film 9 having a structure in an intermediate bonding state between those of the first protective insulating film 3 and the second protective insulating film 6 is formed as a buffer layer at the interface, thereby relaxing the Si dangling bonds to suppress occurrence of the current collapse.

As described above, according to this example, a highly reliable high-withstand-voltage AlGaN/GaN HEMT is realized which suppresses occurrence of the current collapse due to the protective film covering the gate electrode on the compound semiconductor layered structure to improve the device characteristics.

Second Embodiment

This embodiment discloses a structure and a method of manufacturing a Schottky-type AlGaN/GaN HEMT as in the first embodiment but is different from the first embodiment in that the formation state of the first protective insulating film is different. Note that the same constituent members and so on as those in the first embodiment will be denoted by the same reference signs, and a detailed description thereof will be omitted.

FIG. 6A to FIG. 6C and FIG. 7A and FIG. 7B are schematic cross-sectional views illustrating main processes in the method of manufacturing the AlGaN/GaN HEMT according to a second embodiment.

Figure 6A:
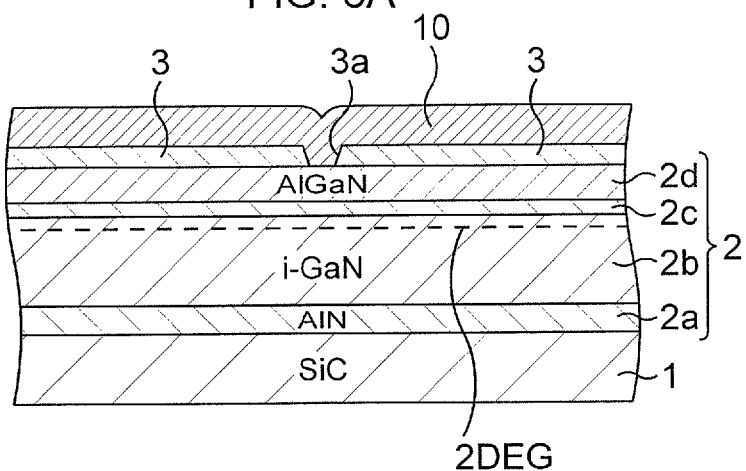
FIG. 6A to FIG. 6C are schematic cross-sectional views illustrating main processes in a method of manufacturing an AlGaN/GaN HEMT according to a second embodiment.

First, the same processes as those in FIG. 1A to FIG. 2A of the first embodiment are performed. The appearance at this time is illustrated in FIG. 6A.

Figure 6B:
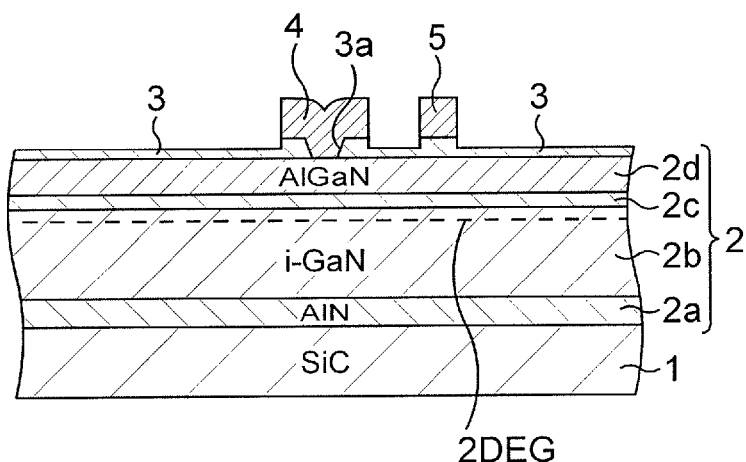

Subsequently, as illustrated in FIG. 6B, a gate electrode 4 and a field plate electrode 5 are formed, and a surface layer of the first protective insulating film 3 is etched.

More specifically, first, a resist is applied on the surface of an electrode material 10. The resist is processed by lithography to remain only in electrode formation planned regions for the gate electrode and the field plate electrode (electrode formation planned regions) in the electrode material 10. Thus, the resist mask covering the electrode formation planned regions is formed.

Using this resist mask, the electrode material 10 and the surface layer of the first protective insulating film 3 are dry etched until a part of the first protective insulating film 3 is removed (overetching). An overetching amount of the surface layer of the first protective insulating film 3 is set to be deeper than the thickness of a later-described third protective insulating film, for example, a depth of about 20 nm. For the dry etching, for example, chlorine-based etching gas can be used. Even when the electrode material 10 and the surface layer of the first protective insulating film 3 are dry etched using the chlorine-based gas, the top of an electron supply layer 2d is covered with the first protective insulating film 3, and therefore the electron supply layer 2d is never exposed to the dry etching and has no etching damage.

Thus, the gate electrode 4 in a shape that fills an electrode recess 3a and rides on the first protective insulating film 3 (having a cross section along the gate length direction in a so-called overhanging shape) is formed in the formation planned region for the gate electrode. At the same time, the field plate electrode 5 is formed on the first protective insulating film 3 in the formation planned region for the field plate electrode. The gate electrode 4 is in Schottky contact with a compound semiconductor layered structure 2 (the electron supply layer 2d) in the electrode recess 3a.

Thereafter, the resist mask is removed by ashing using oxygen plasma or wetting using a chemical solution.

Figure 8:
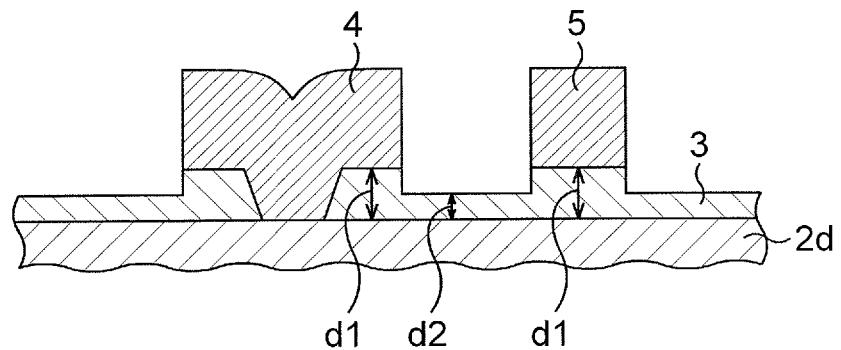
FIG. 8 is an enlarged schematic cross-sectional view of a gate electrode and a field plate electrode in FIG. 6B.

FIG. 8 illustrates an enlarged view of the gate electrode 4 and the field plate electrode 5 in FIG. 6B.

The first protective insulating film 3 is formed by the overetching such that the thickness thereof under an overhanging portion of the gate electrode 4 and under the field plate electrode 5 (a first thickness d1) is larger than the thickness at the other site (a second thickness d2). The difference between the first thickness d1 and the second thickness d2 corresponds to the above-described overhanging amount. In consideration of the thickness of a later-described third protective insulating film of about 10 nm or less, the difference is set to a value within a range of about 10 nm to about 200 nm, here, about 20 nm, larger than the thickness of the third protective insulating film.

Figure 6C:
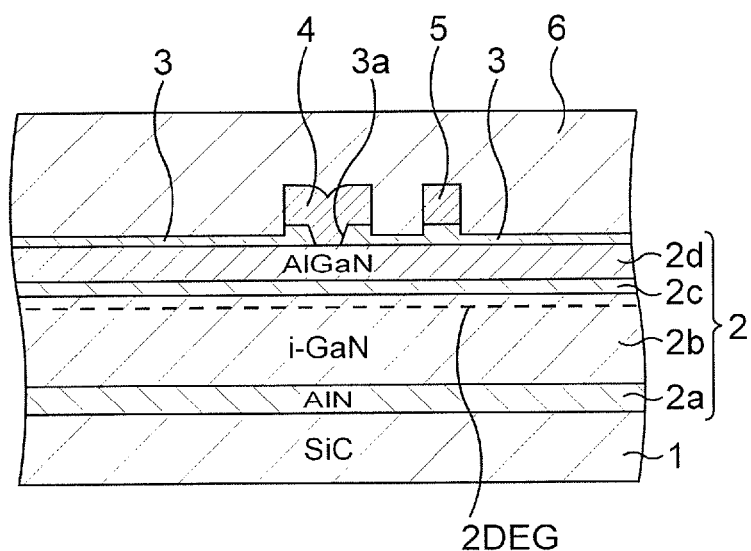

Subsequently, as illustrated in FIG. 6C, a second protective insulating film 6 is formed.

More specifically, silicon oxide ($SiO_2$) is deposited to a thickness of, for example, about 500 nm on the first protective insulating film 3 in a manner to cover the gate electrode 4 and the field plate electrode 5. Thus, a second protective insulating film 6 is formed. $SiO_2$ is deposited by the CVD method using, for example, tetraethoxysilane (TEOS) as a material. $SiO_2$ may be deposited by SOG (Spin On Glass) using TEOS instead of the CVD method. Further, it is also preferable to deposit $SiO_2$ by the CVD method using silane or triethoxysilane as a material instead of using TEOS.

Figure 7A:
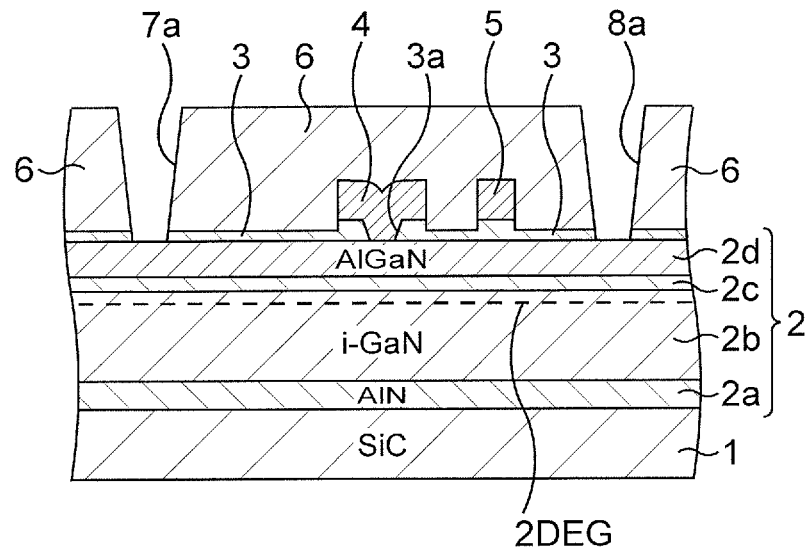
FIG. 7A and FIG. 7B are schematic cross-sectional views, subsequent to FIG. 6A to FIG. 6C, illustrating main processes in the method of manufacturing the AlGaN/GaN HEMT according to the second embodiment.

Subsequently, as illustrated in FIG. 7A, contact holes 7a, 8a are formed in the first protective insulating film 3 and the second protective insulating film 6.

More specifically, a resist is applied on the surface of the second protective insulating film 6. The resist is processed by lithography to form openings in the resist which expose the surface of the second protective insulating film 6 corresponding to formation planned regions for the source electrode and the drain electrode (electrode formation planned regions). Thus, a resist mask having the openings is formed.

The electrode formation planned regions of the second protective insulating film 6 and the first protective insulating film 3 are dry etched and removed until the surface of the electron supply layer 2d is exposed. As an etching gas, for example, fluorine-based gas is used. By performing the dry etching using the fluorine-based gas on the second protective insulating film 6 and the first protective insulating film 3 on the electron supply layer 2d, the etching damage to the exposed electron supply layer 2d can be suppressed. Thus, the contact holes 7a, 8a are formed in the first protective insulating film 3 and the second protective insulating film 6.

Thereafter, the resist task is removed by ashing using oxygen plasma or wetting using a chemical solution.

Figure 7B:
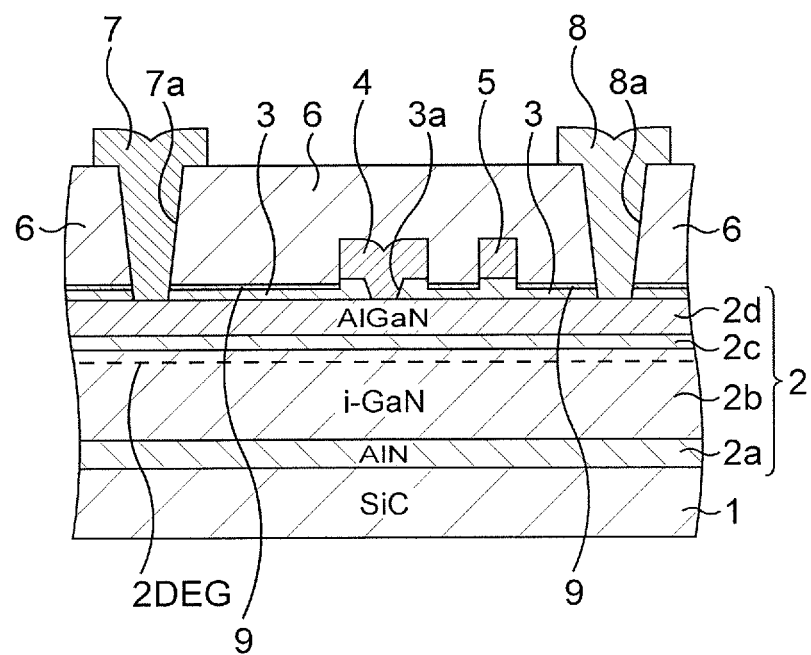

Subsequently, as illustrated in FIG. 7B, a source electrode 7 and a drain electrode 8 are formed.

More specifically, a resist is applied on the second protective insulating film 6, and openings which expose the inside of the contact holes 7a, 8a are formed. Thus, a resist mask having the openings is formed.

Using this resist mask, Ta/Al for example is deposited as an electrode material by the vapor deposition method for example, on the resist mask including the inside of the openings for exposing the inside of the contact holes 7a, 8a. The thickness of Ta is about 20 nm, and the thickness of Al is about 300 nm. By the lift-off method, the resist mask and Ta/Al deposited thereon are removed.

Thereafter, the SiC substrate 1 is heat treated at a temperature of about 500° C. to about 1000° C., for example about 550° C., in a nitrogen atmosphere for example, thereby bringing the remaining Ta/Al into ohmic contact with the electron supply layer 2d. If the temperature of the heat treatment is lower than 500° C., sufficient ohmic contact cannot be obtained. If the temperature of the heat treatment is higher than 1000° C., Al of the electrode material melts and a desired electrode cannot be obtained. By the heat treatment at a temperature of about 500° C. to about 1000° C., a desired electrode with sufficient ohmic contact can be obtained. Thus, the source electrode 7 and the drain electrode 8 are formed such that the inside of the contact holes 7a, 8a are filled with part of the electrode material.

Thereafter, through processes such as forming wirings connected to the gate electrode 4, the source electrode 7, and the drain electrode 8, electrical connection of the field plate electrode 5 with the gate electrode 4 or the source electrode 7 and so on, the Schottky-type AlGaN/GaN.HEMT according to this embodiment is formed.

Figure 9:
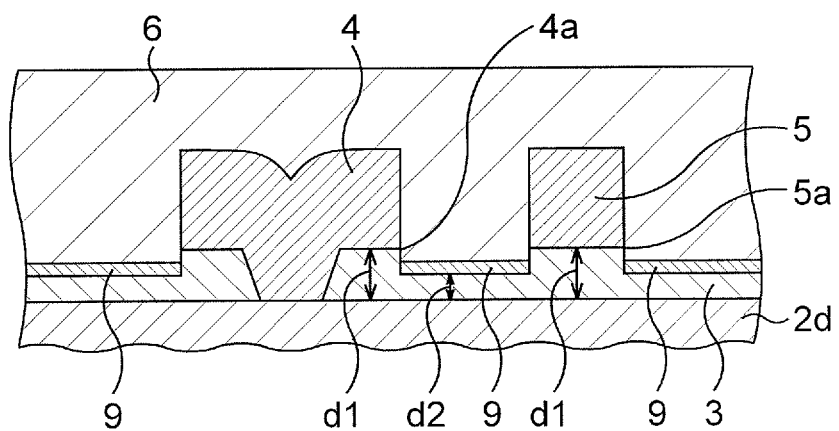
FIG. 9 is an enlarged schematic cross-sectional view of a gate electrode and a field plate electrode in FIG. 7B.

FIG. 9 illustrates an enlarged view of the gate electrode 4 and the field plate electrode 5 in FIG. 7B.

In this embodiment, at the time of FIG. 7B, a third protective insulating film 9 containing silicon oxynitride (SiON) is formed (at the interface) between the first protective insulating film 3 and the second protective insulating film 6. The third protective insulating film 9 is formed to a thickness within a range of about 1 nm to about 10 nm, for example, about 5 nm, smaller than the difference between a first thickness d1 and a second thickness d2 in the first protective insulating film 3.

In this embodiment, the third protective insulating film 9 containing SiON bonded with Si dangling bonds present on the surface of the first protective insulating film 3 is formed at the interface between the first protective insulating film 3 and the second protective insulating film 6. The third protective insulating film 9 having a structure in an intermediate bonding state between those of the first protective insulating film 3 and the second protective insulating film 6 is formed as a buffer layer at the interface, thereby relaxing the Si dangling bonds to suppress occurrence of the current collapse.

Generally, the AlGaN/GaN HEMT has a problem in which an electric field concentration occurs at an edge part on the drain electrode side of the gate electrode at application of high voltage to cause device breakage. By providing the field plate electrode between the gate electrode and the drain electrode, the edge part on the drain electrode side becomes the position where the electric field concentration occurs to diffuse the electric field concentration. It is assumed here that two kinds of protective insulating films of materials different from each other are formed in layers. In this case, even if the field plate electrode is provided, edge parts of the gate electrode and the field plate electrode are in contact with the interface between the upper and lower protective insulating films. When the electric field concentration occurs at the edge parts, dielectric breakdown is caused from the interface between the protective insulating films to bring about a decrease in withstand voltage.

In this embodiment, the field plate electrode 5 is provided between the gate electrode 4 and the drain electrode 7. This structure relaxes the electric field concentration at the edge part on the drain electrode 7 side of the contact surface of the gate electrode 4 with the electron supply layer 2d.

Further, as illustrated in FIG. 9, the first thickness d1 under an overhanging portion of the gate electrode 4 and under the field plate electrode 5 is formed larger than the second thickness d2 at the other site. Further, the difference between the first thickness d1 and the second thickness d2 is set to a value within a range of about 10 nm to about 200 nm, here, about 20 nm, larger than the thickness of the third protective insulating film 9. With this structure, edge parts 4a, 5a on the drain electrode 7 side of the gate electrode 4 and the field plate electrode 5 are displaced from the interface between the first protective insulating film 3 and the second protective insulating film 6 and located on side surfaces of the second protective insulating film 6. Even if an electric field concentration occurs at the edge parts 4a, 5a, there is little influence on the interface because the edge parts 4a, 5a are separated from the interface. This prevents dielectric breakdown in the AlGaN/GaN HEMT to improve the withstand voltage.

If the difference between the first thickness d1 and the second thickness d2 is smaller than 10 nm, a separation distance of the edge parts 4a, 5a from the interface between the first protective insulating film 3 and the second protective insulating film 6 is small (or 0), thereby possibly causing dielectric breakdown from the interface. If the difference is larger than 200 nm, the interface between the first protective insulating film 3 and the second protective insulating film 6 is closer to the electron supply layer 2d and therefore electrons become more likely to be trapped by the Si dangling bonds slightly remaining at the interface, resulting in reduced current collapse suppression effect. Consequently, by setting the difference to about 10 nm to about 200 nm, the dielectric breakdown can be prevented while the current collapse suppression effect is maintained.

As described above, according to this embodiment, a highly reliable high-withstand-voltage AlGaN/GaN HEMT is realized which suppresses occurrence of the current collapse due to the protective film covering the gate electrode on the compound semiconductor layered structure to improve the device characteristics.

Modification Example

Hereinafter, a modification example of the second embodiment will be described. This example discloses a structure and a method of manufacturing an AlGaN/GaN HEMT as in the second embodiment, but exemplifies a so-called MIS-type AlGaN/GaN HEMT in which a gate electrode is present above a semiconductor via a gate insulating film. Note that the same constituent members and so on as those in the second embodiment will be denoted by the same reference signs, and a detailed description thereof will be omitted.

FIG. 10A to FIG. 10C and FIG. 11A to FIG. 11C are schematic cross-sectional views illustrating main processes in the method of manufacturing the AlGaN/GaN HEMT according to the modification example of the second embodiment.

First, the same processes as those in FIG. 1A to FIG. 1C of the first embodiment are performed. In this event, an electrode recess 3a is formed in a first protective insulating film 3 formed on a compound semiconductor layered structure 2.

Figure 10A:
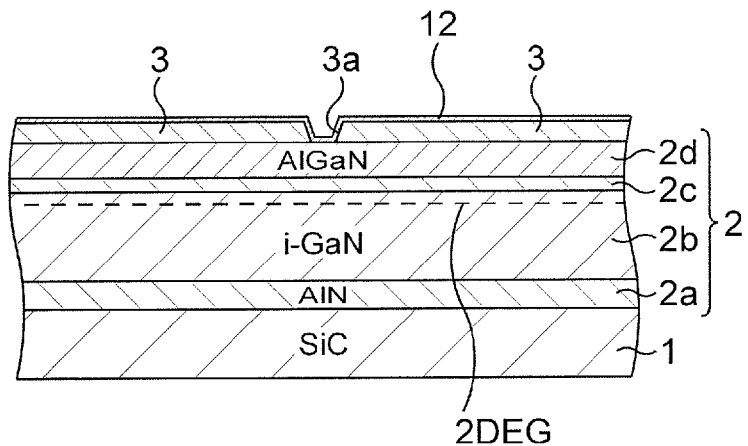
FIG. 10A to FIG. 10C are schematic cross-sectional views illustrating main processes in a method of manufacturing an AlGaN/GaN HEMT according to Modification Example of the second embodiment.

Subsequently, as illustrated in FIG. 10A, a gate insulating film 12 is formed.

In a manner to cover an inner wall surface of the electrode recess 3a, for example, $Al_2O_3$ is deposited as an insulating material on the first protective insulating film 3. $Al_2O_3$ is deposited to a film thickness of about 2 nm to about 200 nm, here, about 50 nm, for example, by an ALD Atomic Layer Deposition) method. Thus, the gate insulating film 12 is formed.

Incidentally, for the deposition of $Al_2O_3$, a plasma CVD method, a sputtering method, or the like, for instance, may be used instead of the ALD method. Further, instead of depositing $Al_2O_3$, a nitride or an oxynitride of Al may be used. Besides, an oxide, a nitride, an oxynitride of Si, Hf, Zr, Ti, Ta, or W or a multilayer of appropriately selected ones from among these may be deposited to form the gate insulating film.

Figure 10B:
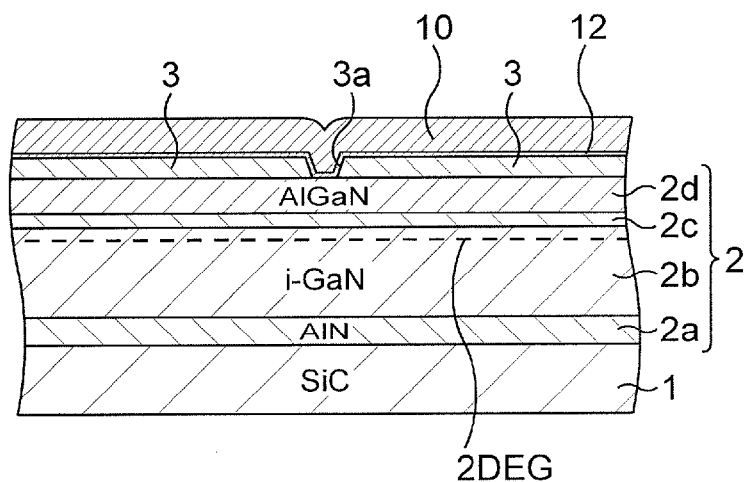

Subsequently, as illustrated in FIG. 10B, an electrode material 10 for a gate electrode and a field plate electrode is deposited.

More specifically, the electrode material 10 for the gate electrode is deposited on the gate insulating film 12 to fill the inside of the electrode recess 3a via the gate insulating film 12. Ni/Au (a lower layer is Ni and an upper layer is Au) for example is deposited as the electrode material 10 by the vapor deposition method for example. The thickness of Ni is about 30 nm, and the thickness of Au is about 400 nm.

Figure 10C:
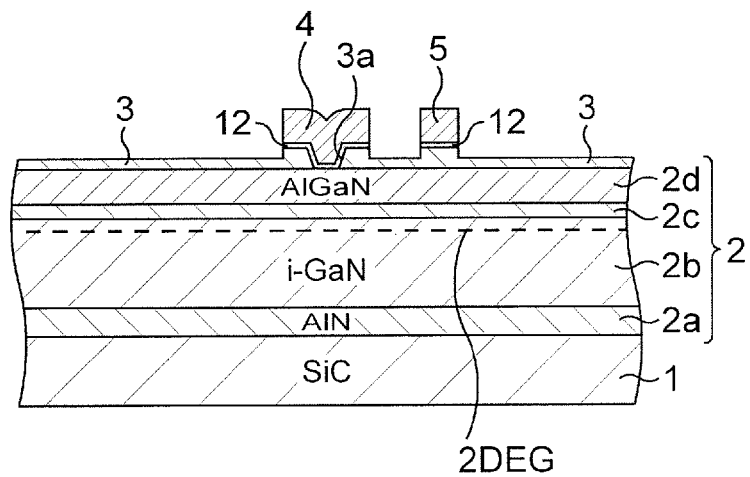

Subsequently, as illustrated in FIG. 10C, a gate electrode 4 and a field plate electrode 5 are formed, and the surface layer of the first protective insulating film 3 is etched.

More specifically, first, a resist is applied on the surface of the electrode material 10. The resist is processed by lithography to remain only in electrode formation planned regions for the gate electrode and the field plate electrode (electrode formation planned regions) in the electrode material 10. Thus, the resist mask covering the electrode formation planned regions is formed.

Using this resist mask, the electrode material 10, the gate insulating film 12, and the surface layer of the first protective insulating film 3 are dry etched until a part of the first protective insulating film 3 is removed (overetching). An overetching amount of the surface layer of the first protective insulating film 3 is set to be deeper than the thickness of a later-described third protective insulating film, for example, a depth of about 20 nm. For the dry etching, for example, chlorine-based etching gas can be used. Even when the electrode material 10 and the surface layer of the first protective insulating film 3 are dry etched using the chlorine-based gas, the top of an electron supply layer 2d is covered with the first protective insulating film 3, and therefore the electron supply layer 2d is never exposed to the dry etching and has no etching damage.

Thus, the gate electrode 4 in a shape that fills the electrode recess 3a via the gate insulating film 12 and rides on the first protective insulating film 3 (having a cross section along the gate length direction in a so-called overhanging shape) is formed in the formation planned region for the gate electrode. At the same time, the field plate electrode 5 is formed on the first protective insulating film 3 via the gate insulating film 12 in the formation planned region for the field plate electrode.

Thereafter, the resist mask is removed by ashing using oxygen plasma or wetting using a chemical solution.

The first protective insulating film 3 is formed by the overetching such that the thickness thereof under an overhanging portion of the gate electrode 4 and under the field plate electrode 5 is larger than the thickness at the other site. The difference in thickness corresponds to the above-described overhanging amount. In consideration of the thickness of a later-described third protective insulating film of about 10 nm or less, the difference in thickness is set to a value within a range of about 10 nm to about 200 nm, here, about 20 nm, larger than the thickness of the third protective insulating film.

Figure 11A:
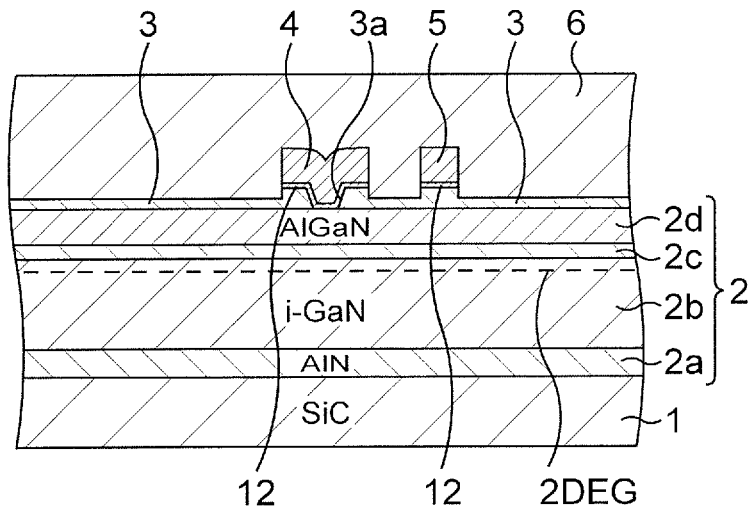
FIG. 11A to FIG. 11C are schematic cross-sectional views, subsequent to FIG. 10A to FIG. 10C, illustrating main processes in the method of manufacturing the AlGaN/GaN HEMT according to Modification Example of the second embodiment.

Subsequently, as illustrated in FIG. 11A, a second protective insulating film 6 is formed.

More specifically, silicon oxide ($SiO_2$) is deposited to a thickness of, for example, about 500 nm on the first protective insulating film 3 in a manner to cover the gate electrode 4 and the field plate electrode 5. Thus, the second protective insulating film 6 is formed. $SiO_2$ is deposited by the CVD method using, for example, tetraethoxysilane (TEOS) as a material. $SiO_2$ may be deposited by SOG (Spin On Glass) using TEOS instead of the CVD method. Further, it is also preferable to deposit $SiO_2$ by the CVD method using silane or triethoxysilane as a material instead of using TEOS.

Figure 11B:
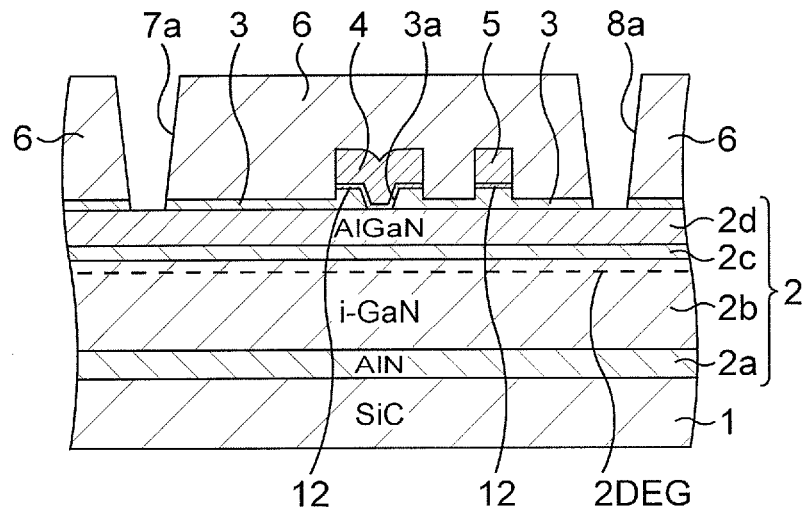

Subsequently, as illustrated in FIG. 11B, contact holes 7a, 8a are formed in the first protective insulating film 3 and the second protective insulating film 6.

More specifically, a resist is applied on the surface of the second protective insulating film 6. The resist is processed by lithography to form openings in the resist which expose the surface of the second protective insulating film 6 corresponding to formation planned regions for the source electrode and the drain electrode (electrode formation planned regions). Thus, a resist mask having the openings is formed.

The electrode formation planned regions of the second protective insulating film 6 and the first protective insulating film 3 are dry etched and removed until the surface of the electron supply layer 2d is exposed. As an etching gas, for example, fluorine-based gas is used. By performing the dry etching using the fluorine-based gas on the second protective insulating film 6 and the first protective insulating film 3 on the electron supply layer 2d, the etching damage to the exposed electron supply layer 2d can be suppressed. Thus, the contact holes 7a, 8a are formed in the first protective insulating film 3 and the second protective insulating film 6.

Thereafter, the resist mask is removed by ashing using oxygen plasma or wetting using a chemical solution.

Figure 11C:
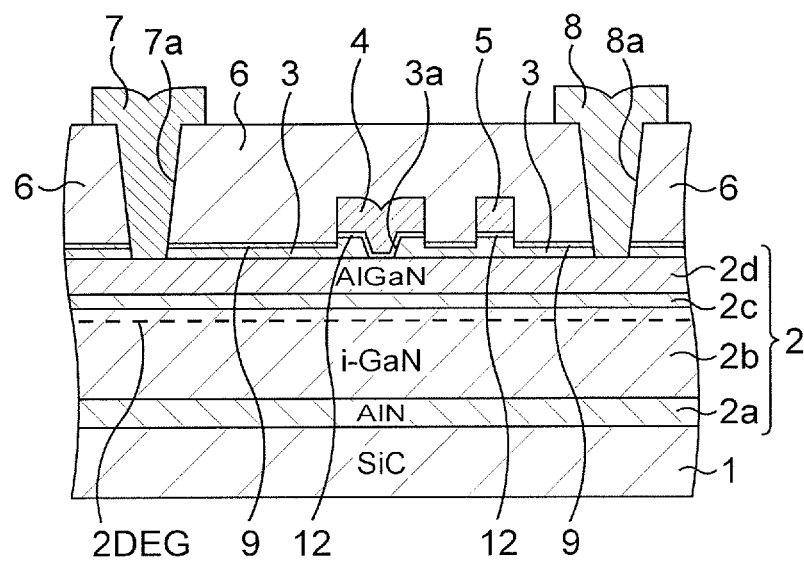

Subsequently, as illustrated in FIG. 11C, a source electrode 7 and a drain electrode 8 are formed.

More specifically, a resist is applied on the second protective insulating film 6, and openings which expose the inside of the contact holes 7a, 8a are formed. Thus, a resist mask having the openings is formed.

Using this resist mask, Ta/Al for example is deposited as an electrode material by the vapor deposition method for example, on the resist mask including the inside of the openings for exposing the inside of the contact holes 7a, 8a. The thickness of Ta is about 20 nm, and the thickness of Al is about 300 nm. By the lift-off method, the resist mask and Ta/Al deposited thereon are removed.

Thereafter, the SiC substrate 1 is heat treated at a temperature of about 500° C. to about 1000° C., for example about 550° C., in a nitrogen atmosphere for example, thereby bringing the remaining Ta/Al into ohmic contact with the electron supply layer 2d. If the temperature of the heat treatment is lower than 500° C., sufficient ohmic contact cannot be obtained. If the temperature of the heat treatment is higher than 1000° C., Al of the electrode material melts and a desired electrode cannot be obtained. By the heat treatment at a temperature of about 500° C. to about 1000° C., a desired electrode with sufficient ohmic contact can be obtained. Thus, the source electrode 7 and the drain electrode 8 are formed such that the inside of the contact holes 7a, 8a are filled with part of the electrode material.

Thereafter, through processes such as forming wirings connected to the gate electrode 4, the source electrode 7, and the drain electrode 8, electrical connection of the field plate electrode 5 with the gate electrode 4 or the source electrode 7 and so on, the MIS-type AlGaN/GaN.HEMT according to this embodiment is formed.

Figure 12:
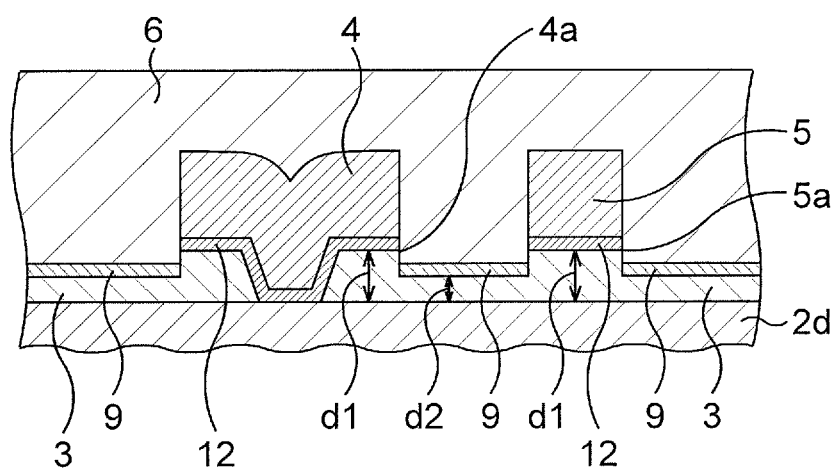
FIG. 12 is an enlarged schematic cross-sectional view of a gate electrode and a field plate electrode in FIG. 11C.

FIG. 12 illustrates an enlarged view of the gate electrode 4 and the field plate electrode 5 in FIG. 11C.

In this example, at the time of FIG. 11C, the third protective insulating film 9 containing silicon oxynitride (SiON) is formed (at the interface) between the first protective insulating film 3 and the second protective insulating film 6. The third protective insulating film 9 is formed to a thickness within a range of about 1 nm to about 10 nm, for example, about 5 nm, smaller than the difference between a first thickness d1 and a second thickness d2 in the first protective insulating film 3.

In this example, the third protective insulating film 9 containing SiON bonded with Si dangling bonds present on the surface of the first protective insulating film 3 is formed at the interface between the first protective insulating film 3 and the second protective insulating film 6. The third protective insulating film 9 having a structure in an intermediate bonding state bonding state between those of the first protective insulating film 3 and the second protective insulating film 6 is formed as a buffer layer at the interface, thereby relaxing the Si dangling bonds to suppress occurrence of the current collapse.

In this example, the field plate electrode 5 is provided between the gate electrode 4 and the drain electrode 7. This structure relaxes the electric field concentration at the edge part on the drain electrode 7 side of the contact surface of the gate electrode 4 with the electron supply layer 2d.

Further, as illustrated in FIG. 12, the first thickness d1 under the overhanging portion of the gate electrode 4 and under the field plate electrode 5 is formed larger than the second thickness d2 at the other site. Further, the difference between the first thickness d1 and the second thickness d2 is set to a value within a range of about 10 nm to about 200 nm, here, about 20 nm, larger than the thickness of the third protective insulating film 9. With this structure, edge parts 4a, 5a on the drain electrode 7 side of the gate electrode 4 and the field plate electrode 5 are displaced from the interface between the first protective insulating film 3 and the second protective insulating film 6 and located on side surfaces of the second protective insulating film 6. Even if an electric field concentration occurs at the edge parts 4a, 5a, there is little influence on the interface because the edge parts 4a, 5a are separated from the interface. This prevents dielectric breakdown in the AlGaN/GaN HEMT to improve the withstand voltage.

If the difference between the first thickness d1 and the second thickness d2 is smaller than 10 nm, a separation distance of the edge parts 4a, 5a from the interface between the first protective insulating film 3 and the second protective insulating film 6 is small (or 0), thereby possibly causing dielectric breakdown from the interface. If the difference is larger than 200 nm, the interface between the first protective insulating film 3 and the second protective insulating film 6 is closer to the electron supply layer 2d and therefore electrons become more likely to be trapped by the Si dangling bonds slightly remaining at the interface, resulting in reduced current collapse suppression effect. Consequently, by setting the difference to about 10 nm to about 200 nm, the dielectric breakdown can be prevented while the current collapse suppression effect is maintained.

As described above, according to this example, a highly reliable high-withstand-voltage AlGaN/GaN HEMT is realized which suppresses occurrence of the current collapse due to the protective film covering the gate electrode on the compound semiconductor layered structure to improve the device characteristics.

Further, dielectric breakdown in the AlGaN/GaN HEMT is prevented to improve the withstand voltage.

Third Embodiment

This embodiment discloses a power supply device to which one kind selected from among the AlGaN/GaN HEMTs of the first and second embodiments and their modification examples is applied.

Figure 13:
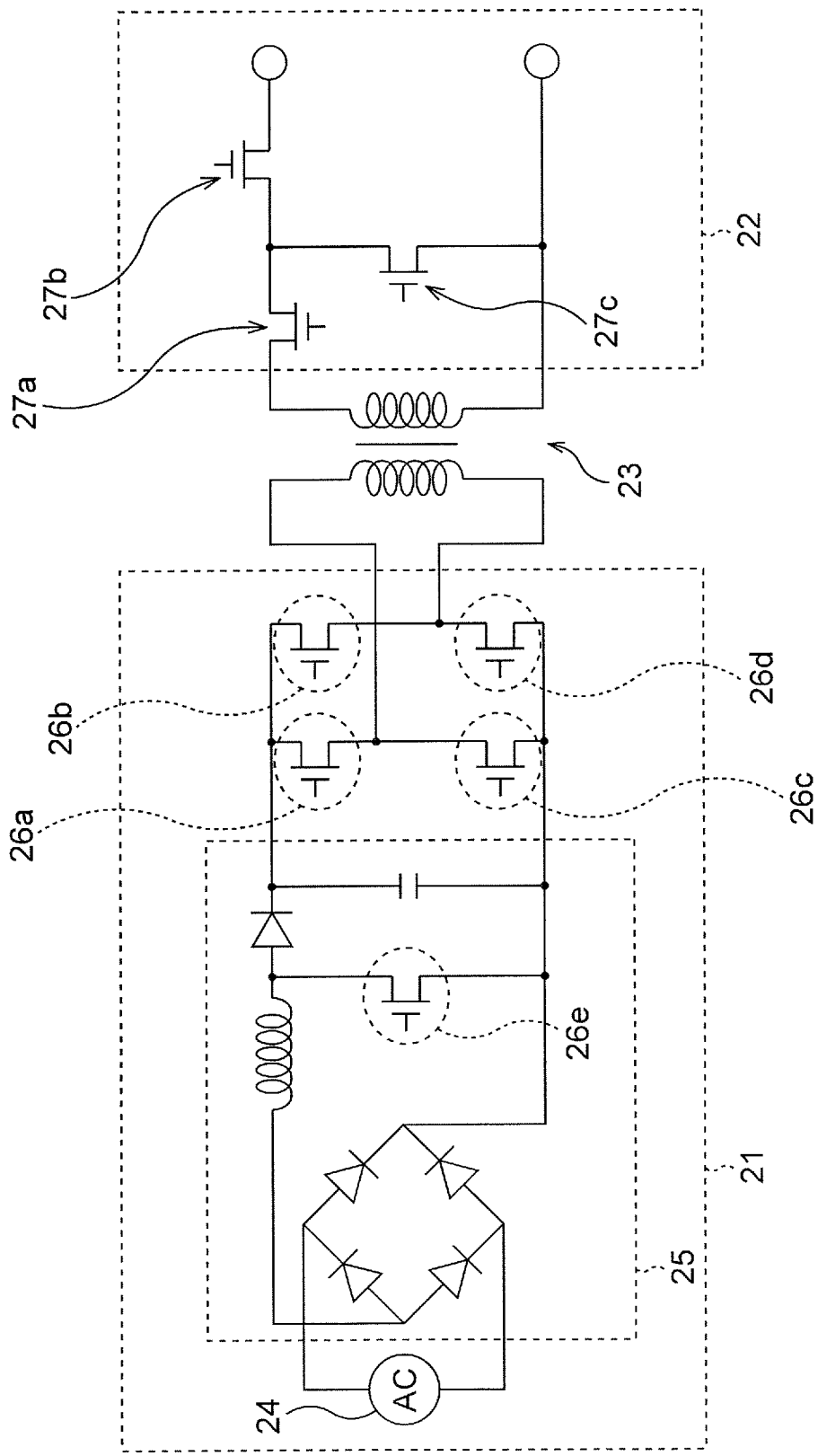
FIG. 13 is a connection diagram illustrating a schematic configuration of a power supply device according to a third embodiment.

FIG. 13 is a connection diagram illustrating a schematic configuration of a power supply device according to a third embodiment.

The power supply device according to this embodiment includes a high-voltage primary-side circuit 21, a low-voltage secondary-side circuit 22, and a transformer 23 disposed between the primary-side circuit 21 and the secondary-side circuit 22.

The primary-side circuit 21 includes an AC power supply 24, a so-called bridge rectifying circuit 25, and a plurality of (four here) switching elements 26a, 26b, 26c, 26d. Further, the bridge rectifying circuit 25 has a switching element 26e.

The secondary-side circuit 22 includes a plurality of (three here) switching elements 27a, 27b, 27c.

In this embodiment, the switching elements 26a, 26b, 26c, 26d, 26e of the primary-side circuit 21 are each one kind selected from among the AlGaN/GaN HEMTs of the first and second embodiments and their modification examples. On the other hand, the switching elements 27a, 27b, 27c of the secondary-side circuit 22 are each an ordinary MIS.FET using silicon.

In this embodiment, a highly reliable high-withstand-voltage AlGaN/GaN HEMT which suppresses occurrence of the current collapse due to the protective film covering the gate electrode on the compound semiconductor layered structure to improve the device characteristics is applied to a power supply circuit. This realizes a highly reliable large-power power supply circuit.

Fourth Embodiment

This embodiment discloses a high-frequency amplifier to which one kind selected from among the AlGaN/GaN HEMTs of the first and second embodiments and their modification examples is applied.

Figure 14:
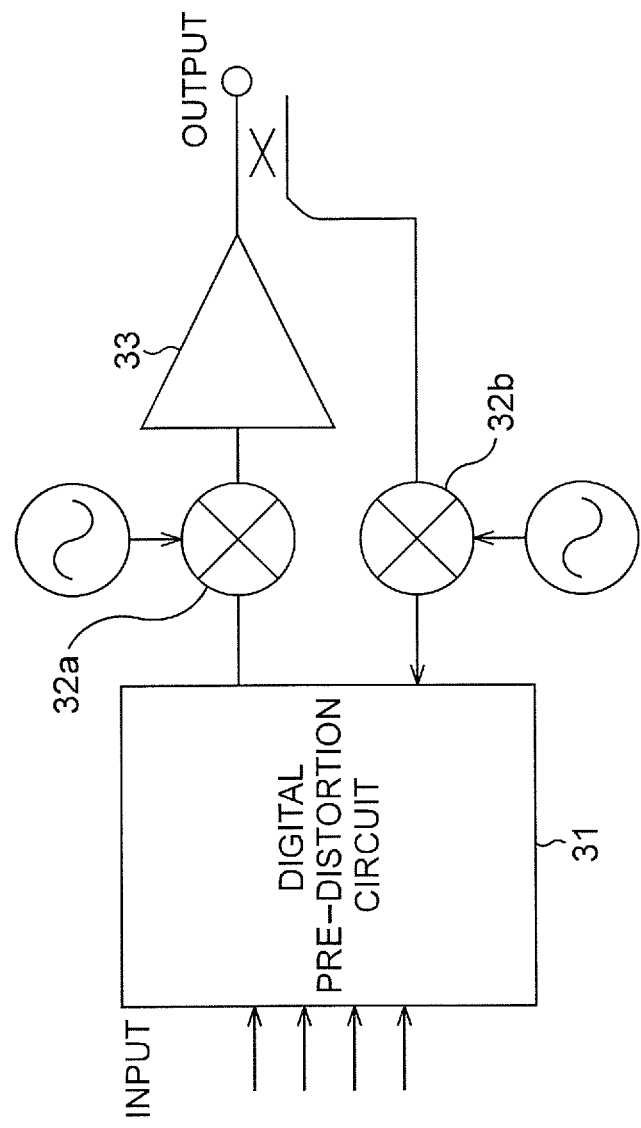
FIG. 14 is a connection diagram illustrating a schematic configuration of a high-frequency amplifier according to a fourth embodiment.

FIG. 14 is a connection diagram illustrating a schematic configuration of a high-frequency amplifier according to a fourth embodiment.

The high-frequency amplifier according to this embodiment includes a digital pre-distortion circuit 31, mixers 32a, 32b, and a power amplifier 33.

The digital pre-distortion circuit 31 compensates nonlinear distortion of an input signal. The mixer 32a mixes the input signal whose nonlinear distortion is compensated and an AC signal. The power amplifier 33 amplifies the input signal mixed with the AC signal, and has one kind selected from among the AlGaN/GaN HEMTs of the first and second embodiments and their modification examples. In FIG. 14, by, for example, changing the switches, an output-side signal can be mixed with the AC signal by the mixer 32b, and the resultant can be sent out to the digital pre-distortion circuit 31.

In this embodiment, a highly reliable high-withstand-voltage AlGaN/GaN HEMT which suppresses occurrence of the current collapse due to the protective film covering the gate electrode on the compound semiconductor layered structure to improve the device characteristics is applied to a high-frequency amplifier. This realizes a highly reliable high-withstand-voltage high-frequency amplifier.

Other Embodiments

In the first to fourth embodiments and their modification examples, the AlGaN/GaN HEMTs are exemplified as the compound semiconductor devices. Other than the AlGaN/GaN HEMTs, the following HEMTs are applicable as the compound semiconductor devices.

Other HEMT Example 1

This example discloses an InAlN/GaN HEMT as a compound semiconductor device.

InAlN and GaN are compound semiconductors whose lattice constants can be made close to each other by their compositions. In this case, in the above-described first to fourth embodiments and their modification examples, the electron transit layer is formed of i-GaN, the intermediate layer is formed of i-InAlN, and the electron supply layer is formed of n-InAlN. In this case, piezoelectric polarization barely occurs, and thus the two-dimensional electron gas mainly occurs by spontaneous polarization of InAlN.

According to this example, a highly reliable high-withstand-voltage InAlN/GaN HEMT is realized which suppresses occurrence of the current collapse due to the protective film covering the gate electrode on the compound semiconductor layered structure to improve the device characteristics, as in the above-described AlGaN/GaN HEMT.

Other HEMT Example 2

This example discloses an InAlGaN/GaN HEMT as a compound semiconductor device.

GaN and InAlGaN are compound semiconductors that the lattice constant of the latter can be made smaller than the lattice constant of the former by their compositions. In this case, in the above-described first to fourth embodiments and their modification examples, the electron transit layer is formed of i-GaN, the intermediate layer is formed of i-InAlGaN, and the electron supply layer is formed of n-InAlGaN.

According to this example, a highly reliable high-withstand-voltage InAlGaN/GaN HEMT is realized which suppresses occurrence of the current collapse due to the protective film covering the gate electrode on the compound semiconductor layered structure to improve the device characteristics, as in the above-described AlGaN/GaN HEMT.

According to above aspects, a highly reliable high-withstand-voltage compound semiconductor device is realized which suppresses occurrence of current collapse due to a protective film covering an electrode on a compound semiconductor layered structure to improve device characteristics.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
a compound semiconductor layered structure;
an electrode formed above the compound semiconductor layered structure, the electrode having a top surface opposite the compound semiconductor layered structure, the top surface extending from a first side surface of the electrode to a second side surface of the electrode; and
a first protective insulating film over a surface of the compound semiconductor layered structure; wherein
a recess is formed through the first protective insulating film, and a portion of the electrode is in the recess;
a first portion of the electrode is formed on the first protective insulating film, the first portion including the first side surface of the electrode;
the first protective insulating film includes a first region which is beneath the first portion of the electrode, the first region having a first thickness; and
the first protective insulating film includes a second region where the first portion of the electrode is not over the first protective insulating film, the second region having a second thickness, wherein
an upper surface of the first protective insulating film includes a step having a side surface that is coplanar to the first side surface of the electrode, and wherein the first thickness is larger than the second thickness.

2. The compound semiconductor device according to claim 1, further comprising a second protective insulating film that covers the electrode and is on the first protective insulating film, and a third protective insulating film that is formed between the first protective insulating film and the second protective insulating film.

3. The compound semiconductor device according to claim 1, wherein a difference between the first thickness and the second thickness is a value within a range of 10 nm to about 200 nm.

4. The compound semiconductor device according to claim 2, wherein a difference between the first thickness and the second thickness is larger than a thickness of the third protective insulating film.

5. The compound semiconductor device according to claim 1, wherein the electrode includes a gate electrode and a field plate electrode arranged away from and side by side with the gate electrode.

6. The compound semiconductor device according to claim 2, wherein the third protective insulating film has a thickness within a range of 1 nm to 10 nm.

7. The compound semiconductor device according to claim 1, further comprising a gate insulating film formed in the recess between the electrode and the compound semiconductor layered structure.

8. A power supply circuit comprising a transformer, and a high-voltage circuit and a low-voltage circuit across the transformer,
the high-voltage circuit comprising a transistor,
the transistor comprising:
a compound semiconductor layered structure;
an electrode formed above the compound semiconductor layered structure, the electrode having a top surface opposite the compound semiconductor layered structure, the top surface extending from a first side surface of the electrode to a second side surface of the electrode; and
a first protective insulating film that covers a surface of the compound semiconductor layered structure and is made of silicon nitride as a material; wherein
a recess is formed through the first protective insulating film, and a portion of the electrode is in the recess;
a first portion of the electrode is formed on the first protective insulating film, the first portion including the first side surface of the electrode;
the first protective insulating film includes a first region which is beneath the first portion of the electrode, the first region having a first thickness; and
the first protective insulating film includes a second where the first portion of the electrode is not over the first protective insulating film, the second region having a second thickness, wherein an upper surface of the first protective insulating film includes a step having a side surface that is coplanar to the first side surface of the electrode, and wherein the first thickness is larger than the second thickness.

9. The compound semiconductor device according to claim 2, wherein the third protective insulating film comprises silicon oxynitride.

10. The power supply circuit according to claim 8, wherein the transistor further comprises a gate insulating film formed in the recess between the electrode and the compound semiconductor layered structure.

* * * * *